United States Patent [19]

DeVore

[11] Patent Number: 5,033,066
[45] Date of Patent: Jul. 16, 1991

[54] EVENT TAGGING TIME DELAY

[75] Inventor: Doug DeVore, Pasadena, Calif.

[73] Assignee: Hughes Aircraft Company, Los Angeles, Calif.

[21] Appl. No.: 480,999

[22] Filed: Feb. 16, 1990

[51] Int. Cl.5 .................... H03K 5/135; H03K 21/00
[52] U.S. Cl. ....................................... 377/39; 377/26; 377/43; 328/55; 307/603
[58] Field of Search .............. 377/43, 39, 26; 328/55; 307/603

[56] References Cited

U.S. PATENT DOCUMENTS

| 3,833,854 | 9/1974 | Schonover | 377/43 |
| 4,290,022 | 9/1981 | Puckette | 328/55 |
| 4,468,796 | 8/1984 | Suga | 377/43 |
| 4,517,684 | 5/1985 | Fennel | 377/39 |
| 4,809,221 | 2/1989 | Magliocco et al. | 377/39 |
| 4,870,665 | 9/1989 | Vaughn | 377/39 |

Primary Examiner—John S. Heyman
Attorney, Agent, or Firm—Michael W. Sales; Wanda K. Denson-Low

[57] ABSTRACT

A time delay circuit for providing a delayed replica of a digital input signal including first and second counters for providing first and second count outputs offset relative to each other by a predetermined value indicative of a predetermined delay, and further including a first-in first-out (FIFO) memory for controllably storing selected values of the digital input signal together with corresponding first count output values. First comparison circuitry compares each digital input with the immediately prior digital input, and controls the FIFO memory to store (a) each digital input which is different from the immediately prior digital input, and (b) the first counter output value associated therewith. The FIFO memory circuit provides an output comprising (1) a digital output that corresponds to the earliest changed digital output which has not yet been utilized in the delayed replica of the digital input signal, and (2) a FIFO count output that corresponds to the first counter output value associated with such digital output. Second comparison circuitry responsive to the second counter output and the FIFO count output controls the FIFO memory circuit to change its output when the second counter output and the FIFO count output are equal.

6 Claims, 1 Drawing Sheet 5,033,066

EVENT TAGGING TIME DELAY

BACKGROUND OF THE INVENTION

The disclosed invention is generally directed to time delay circuits, and is more particularly directed to a digital time delay circuit which does not utilize extensive shift register circuits, and further does not utilize high speed memory devices.

Time delay circuits are utilized to provide a delayed replica of a time varying signal, and are utilized in various types of signal processing including, for example, radar systems.

Known time delay circuits have included extensive banks of shift register circuitry for transferring data from one stage to another, where the number of stages is determined by the maximum delay required. It is well understood that the use of shift register time delay circuitry involves considerable circuitry when the required delays are large, which further results in greater power consumption.

Other known circuitry include high speed memory systems that continuously store the value of the input for later output. High speed memory, however, tends to be expensive, and large amounts of memory would be required for longer delays.

A further consideration with known time delay circuits is the difficulty in changing the delay provided.

SUMMARY OF THE INVENTION

It would therefore be an advantage to provide a time delay circuit which does not utilize long banks of shift register high speed memory.

Another advantage would be to provide a time delay circuit which is readily adapted to provide different delays.

The foregoing and other advantages and features are provided in a time delay circuit which includes a first counter responsive to a clock signal for providing a first counter output, and a second counter responsive to the clock signal and synchronized to the first counter for providing a second counter output, wherein the second counter output is less than the first counter output by a predetermined value which corresponds to a selected predetermined delay. A comparison circuit is responsive to a digital input signal which is clocked by the reference clock signal for comparing each digital input with the immediately prior digital input, and controls a first-in first-out (FIFO) memory to store (a) each digital input which is different from the immediately prior digital input, and (b) the first counter output value associated therewith. The first-in first-out memory circuit provides an output comprising (1) a digital output that corresponds to the earliest changed digital output which has not yet been utilized in the delayed replica of the digital input signal, and (2) a FIFO count output that corresponds to the first counter output value associated with such digital output. A second comparison means is responsive to the second counter output and the FIFO count output for controlling the first-in first-out memory circuit to change its output when the second counter output and the FIFO count output are equal.

DESCRIPTION OF THE DRAWING

The advantages and features of the disclosed invention will readily be appreciated by persons skilled in the art from the following detailed description when read in conjunction with the drawing wherein.

DETAILED DESCRIPTION

Figure 1:
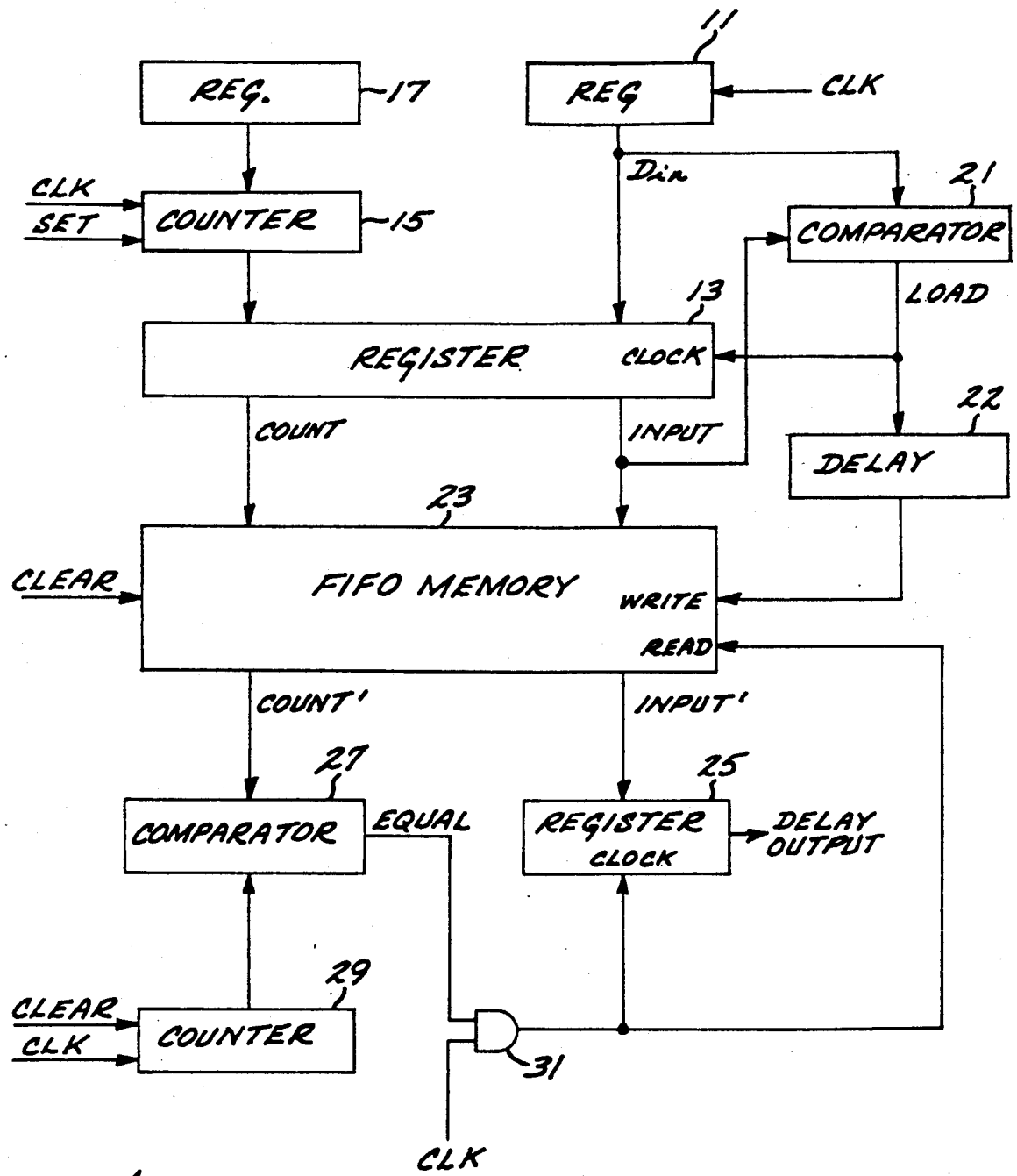
FIG. 1 is a block diagram of the disclosed ti delay circuit.

In the following detailed description and in the several figures of the drawing, like elements are identified with like reference numerals.

Referring now to FIG. 1, illustrated therein is a time delay circuit 10 which provides a delayed replica of a digital input signal $D_{in}$ which comprises a sequence of one or more parallel bits. The time delay circuit 10 is a synchronous system, and for illustration purposes $D_{in}$ is provided by a clocked register 11 which is clocked with a reference clock CLK. The digital input signal $D_{in}$ can be provided by other circuitry, so long as it is synchronized with the reference clock signal CLK.

The digital input signal $D_{in}$ is provided to predetermined stages of a D-type flip-flop register 13, which also receives in other predetermined stages the output of a synchronous counter 15. The synchronous counter 15 is responsive to the reference clock signal CLK, and further receives a preset count value from a register 17 which is responsive to control circuitry (not shown) and stores a predetermined value indicative of the selected delay provided by the time delay circuit 10. The counter 15 is preset to the value in the register 17 in response to a SET signal.

The output of the flip-flop register 13 corresponding to the digital input signal $D_{in}$ is referred to as the INPUT word, while the output corresponding to the output of the counter 15 is referred to as the COUNT word.

The digital input $D_{in}$ is further coupled to a comparator 21, which is also responsive to the INPUT word provided by the flip-flop register 13. The comparator 21 provides an active LOAD signal in the event the digital input $D_{in}$ and the INPUT word provided by the flip-flop register 13 are not equal. The LOAD signal is coupled to the clock input of the flip-flop register 13, and is further provided to a delay circuit 22. The delay circuit 22 provides a delayed replica of the LOAD signal to the WRITE input control of a first-in first-out (FIFO) memory 23. The flip-flop register 13 functions as a buffer for the FIFO memory 23 which is typically slower than the counter 15.

As is well known, a FIFO memory controllably stores input data and provides such data as outputs in the sequence the data was inputted. Data is inputted via an appropriate active signal on the WRITE control input of the FIFO, while data is outputted pursuant to an appropriate active signal on the READ control input of the FIFO. Specifically, an active signal on the READ input causes the FIFO output to change to the data next in sequence. Thus, after a FIFO is cleared, the first input data read into the FIFO will appear at the output. Subsequent input data read into the FIFO will be stored, but the FIFO output will not change until the appropriate active signal on its READ input.

An active LOAD signal causes the flip-flop register 13 to store the input signal $D_{in}$ and the associated count output of the synchronous counter 15. After those inputs are stored, the delayed replica of the LOAD signal as provided by the delay circuit 22 causes the INPUT word and the COUNT word provided by the flip-flop register 13 to be written in parallel into the FIFO memory 23. Thus, if the digital input signal $D_{in}$ changes in value for a given clock period, the changed value and the corresponding counter output provided by the counter 15 are stored in the FIFO memory circuit 23. Further, the changed value remains in the flip-flop register 13 for comparison with subsequent values of the digital input signal $D_{in}$.

The output provided by the FIFO memory circuit 23 includes bits that correspond to the INPUT and COUNT words and are referred to as INPUT' and COUNT' words.

The INPUT' word provided by the FIFO memory circuit 23 is coupled to a register 25, and the COUNT' word provided by the FIFO memory circuit 23 is coupled to a comparator circuit 27. The output of a synchronous counter 29 is also coupled to the comparator circuit 27 which provides an active EQUAL output signal when the inputs to the comparator are equal. The synchronous counter circuit 29 is clocked with the reference clock signal CLK, and is synchronized with the counter 15. The counter circuit 29 is also responsive to a CLEAR signal which causes the counter circuit to be zero.

By way of example, the EQUAL output signal provided by the comparator 27 is high when active, and is coupled to a two-input AND gate 31. The reference clock signal CLK is provided as the other input to the AND gate 31.

The output of the AND gate 31 is provided to the clock input of the register 25 and to the READ control input of the FIFO 23. The positive going transition of the output of the AND gate 31 causes the register 25 to be loaded with the INPUT' word provided by the FIFO memory circuit 23, and further causes the FIFO memory circuit 23 to change its output to the next in sequence values of the INPUT and COUNT words that were read into the FIFO memory circuit 23 (i.e., a new FIFO output is written). The output of the register 25 comprises the delayed replica of the digital input $D_{in}$. In the event the circuitry (not shown) utilizing the delayed version of the digital input $D_{in}$ includes an input buffer or register and clocking circuitry, the INPUT' word provided by the FIFO memory circuit 23 and the output of the AND gate 31 can be provided directly thereto. The positive going transition of the AND gate output indicates that the INPUT' word is now the new value of the delayed digital signal.

It should be readily appreciated that the above described write and read functions of the FIFO memory 23 are provided by standard, off the shelf circuits, and are well understood by persons skilled in the art. It should be noted that sometimes the write operation is referred to as a load operation.

It should also be appreciated that separate FIFO memories could be utilized for storing the changed values of the digital input and the associated counter values, but, depending on the number of bits in the INPUT and COUNT words, available FIFO memories allow the use of one FIFO memory for storing both values.

The time delay circuit 10 operates as follows. The register 17 is loaded with a value the corresponds to the selected delay, the registers 11, 13, 25 are cleared to zero, and the FIFO memory circuit is cleared and provides a zero output. The counter 15 is preset to the value in the register 17, while the counter 29 is set to zero. The digital input is then clocked into the register 11 via the reference clock signal which also clocks the counters 15, 29. A replica of the digital input signal will being to appear at the output of the register 25 after a time delay equal to the preset count value times the clock period of the reference clock signal CLK.

In the foregoing time delay circuit, the maximum time delay is equal to $2^N$ times the clock period, where N is the number of bits in each of the counters 15, 29. The minimum time delay is the sum of (a) the write time of the FIFO, and (b) the number of clock cycles required to read the INPUT and COUNT words into the FIFO. The minimum signal resolution is one clock period, or the write through time of the FIFO memory, whichever is greater.

The foregoing has been a disclosure of an efficient and compact time delay circuit which does not utilize extensive shift register circuitry, and further does not utilize expensive high speed memory, instead using inexpensive, readily available first-in first-out memories. The disclosed time delay circuit further provides for simple selection of the time delay provided.

Although the foregoing has been a description and illustration of specific embodiments of the invention, various modifications and changes thereto can be made by persons skilled in the art without departing from the scope and spirit of the invention as defined by the following claims.

What is claimed is:

1. A time delay circuit for providing a delayed replica of a digital input signal, comprising:
   a first counter responsive to a reference clock signal for providing a first counter output;
   a second counter responsive to said reference clock signal and synchronized to said first counter for providing a second counter output, said second counter output being offset relative to said first counter output by a predetermined value which corresponds to a predetermined delay;
   data storage means for storing selected values of said digital input signal together with corresponding first counter output values, and for controllably outputting the stored values in the same sequence they were stored;
   first comparison means responsive to the digital input signal for comparing each digital input with the immediately preceding digital input, and for controlling said storage means to store (a) each digital input which is different from the immediately preceding digital input, and (b) the first counter output value associated therewith, whereby the output of said storage means comprises (1) a digital output and (2) a storage means count output that corresponds to the first counter output value associated with such digital output; and
   second comparison means responsive to said second counter output and said storage means count output for controlling said storage means circuit to change its output when said second counter output and said storage means count output are equal.

2. The time delay circuit of claim 1 wherein said storage means comprises a first-in first-out memory.

3. The time delay circuit of claim 1 wherein said first comparison means comprises:
   a register for controllably storing selected values of the digital input signal; and
   a comparator circuit for comparing the contents of said register with the present value of the digital input signal, said register being loaded with the present value of the the digital input signal when the comparison indicates inequality.

4. The time delay circuit of claim 3 wherein said comparator controls said storage means to load the present value of the digital input signal when the comparison indicates inequality.

5. The time delay circuit of claim 1 wherein said second comparison means comprises:

a comparator circuit for comparing said second counter output and said storage means count output; and gating means responsive to said comparator circuit for providing a gating signal when said comparator circuit indicates equality.

6. The time delay circuit of claim 5 wherein said gating signal is coupled to said storage means and causes said storage means to provide the output next in sequence.

* * * * *